(12) United States Patent
Jeong

(10) Patent No.: US 9,219,247 B2
(45) Date of Patent: Dec. 22, 2015

(54) ORGANIC LIGHT-EMITTING DISPLAY DEVICE AND METHOD OF MANUFACTURING THE SAME

(75) Inventor: Ho-Young Jeong, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 163 days.

(21) Appl. No.: 13/587,851

(22) Filed: Aug. 16, 2012

(65) Prior Publication Data

US 2013/0207131 A1 Aug. 15, 2013

(30) Foreign Application Priority Data

Feb. 9, 2012 (KR) .......................... 10-2012-0013330

(51) Int. Cl.
*H05B 33/04* (2006.01)
*H01L 51/52* (2006.01)

(52) U.S. Cl.
CPC .......... *H01L 51/5259* (2013.01); *H01L 51/5246* (2013.01)

(58) Field of Classification Search
CPC ... H01L 51/5246; H01L 51/5259; H05B 33/04; H01J 17/24
USPC .................................. 313/512, 553, 554, 555
See application file for complete search history.

(56) References Cited

U.S. PATENT DOCUMENTS

| | | | |
|---|---|---|---|
| 2001/0033946 A1* | 10/2001 | Mashiko et al. ............... | 428/690 |
| 2003/0122476 A1* | 7/2003 | Wang et al. ................... | 313/493 |
| 2004/0023591 A1 | 2/2004 | Matsuoka et al. | |
| 2004/0051449 A1* | 3/2004 | Klausmann et al. .......... | 313/512 |
| 2005/0269926 A1* | 12/2005 | Fukuoka et al. .............. | 313/123 |
| 2008/0136319 A1 | 6/2008 | Yoon | |
| 2008/0224601 A1* | 9/2008 | Frischknecht ................ | 313/504 |
| 2009/0085480 A1* | 4/2009 | Sakai et al. ................... | 313/506 |
| 2009/0215349 A1 | 8/2009 | Sakurai | |

FOREIGN PATENT DOCUMENTS

| | | |
|---|---|---|
| KR | 2003-0084746 | 11/2003 |
| KR | 10-2006-0103048 | 9/2006 |
| KR | 10-2009-0073478 A | 7/2009 |
| KR | 10-2009-0091017 | 8/2009 |

* cited by examiner

*Primary Examiner* — Andrew Coughlin
(74) *Attorney, Agent, or Firm* — Christie, Parker & Hale, LLP

(57) ABSTRACT

An organic light-emitting display device including a substrate; a sealing sheet, which covers the substrate; a getter, which is interposed between at least a portion of the substrate and the sealing sheet; and an adhesive layer comprising an adhesive, which bonds the sealing sheet onto the substrate, wherein a getter-housing groove is in surfaces of the sealing sheet and the adhesive layer facing the substrate, and the getter is located in the getter-housing groove.

9 Claims, 5 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims priority to and the benefit of Korean Patent Application No. 10-2012-0013330, filed on Feb. 9, 2012, in the Korean Intellectual Property Office, the disclosure of which is incorporated herein in its entirety by reference.

BACKGROUND

1. Field

Aspects of embodiments of the present invention relate to a display device, and more particularly, to an organic light-emitting display device directed towards increasing a filling amount of a getter and a method of manufacturing the same.

2. Description of the Related Art

An organic light-emitting display device may have wide viewing angles, high contrast, and short response times. The organic light-emitting display device may be used as a display device of a mobile device, such as, a digital camera, a video camera, a camcorder, a portable information terminal, a smartphone, a laptop computer, a tablet personal computer, or a flexible display device, and other electronic/electric products such an ultrathin television (TV).

The organic light-emitting display device may realize colors by using a principle of recombining holes and electrons, which are injected into an anode and a cathode, in an organic emission layer to emit light. When excitons formed of a combination of the injected holes and electrons drops from an excitation state to a ground state, light is emitted.

The organic light-emitting display device may be deteriorated by moisture penetration. Therefore, a sealing structure may be used to reduce or prevent moisture penetration. For this, in the organic light-emitting display device, a device may be formed on a substrate and may cover the resultant structure with, for example, a metal layer or a glass plate in order to reduce or prevent oxygen or moisture penetration from the outside. However, the metal layer or the glass plate may increase a thickness of the organic light-emitting display device and may make a sealing process complicated.

SUMMARY

Aspects of embodiments of the present invention provide an organic light-emitting display device directed toward increasing an amount of a getter, when covering a sealing sheet on a substrate, to extend a life thereof, and a method of manufacturing the same.

According to an aspect of the present invention, there is provided an organic light-emitting display device including: a substrate; a sealing sheet, which covers the substrate; a getter, which is interposed between at least a portion of the substrate and the sealing sheet; and an adhesive layer comprising an adhesive, which bonds the sealing sheet onto the substrate, wherein a getter-housing groove is in surfaces of the sealing sheet and the adhesive layer facing the substrate, and the getter is located in the getter-housing groove.

The getter-housing groove may include opened first areas of the adhesive layer where the adhesive is not located and second areas of the sealing sheet, the second areas being continuous with the opened first areas in a direction away from a first surface of the sealing sheet that faces the substrate.

The opened first areas and the second areas may have groove shapes which extend in a thickness direction of the sealing sheet.

In one embodiment, at least a portion of a second surface of the sealing sheet opposing the first surface of the sealing sheet has a step difference. Protrusion parts may protrude from a horizontal part of the second surface of the sealing sheet to correspond to depths of the second areas in a direction receding away from the substrate.

Thicknesses of the getter may be a sum of corresponding thicknesses of the opened first areas and corresponding thicknesses of the second areas.

In one embodiment, the adhesive is interposed between at least a portion of the substrate and the sealing sheet, the adhesive does not cover the second areas, and areas where the adhesive does not cover the second areas include the opened first areas.

The sealing sheet may be a flexible thin film sheet.

The adhesive may be located on a whole area of a surface of the sealing sheet.

The adhesive may be partially located along an edge of the sealing sheet.

According to another aspect of the present invention, there is provided a method of manufacturing an organic light-emitting display device, the method including: placing a sealing sheet, which includes a first surface, onto a chuck, which has a groove; coating an adhesive layer, which includes an adhesive, on the first surface; coating a getter on a substrate; and arranging the getter so that the getter is located in a getter-housing groove in the adhesive layer and the sealing sheet when the sealing sheet is compressed onto the substrate using the chuck.

The method may further include attracting a second surface of the sealing sheet onto a surface of the chuck, thereby inserting a partial area of the second surface of the sealing sheet into the groove of the chuck so that the second surface has a step difference. In one embodiment, attracting the second surface of the sealing sheet onto the surface of the chuck forms protrusion parts, which protrude from a horizontal part of the second surface of the sealing sheet in a direction toward the chuck to form second areas in the sealing sheet.

When coating the adhesive layer on the first surface, the adhesive may not be located on the first surface of the sealing sheet where the second areas are formed, which forms opened first areas of the adhesive layer, and the opened first areas may be formed to be continuous with the second areas in a direction away from a first surface of the sealing sheet.

The method may further include filling the opened first areas of the adhesive layer and the second areas of the sealing sheet with the getter when the sealing sheet is compressed onto the substrate.

The getter may be coated on the substrate through a dispenser.

In one embodiment, the method further includes adhering the sealing sheet onto the substrate through vacuum compression.

BRIEF DESCRIPTION OF THE DRAWINGS

The above, and other features and aspects of embodiments of the present invention, will become more apparent by describing exemplary embodiments of the present invention with reference to the attached drawings in which.

DETAILED DESCRIPTION

Figure 1:
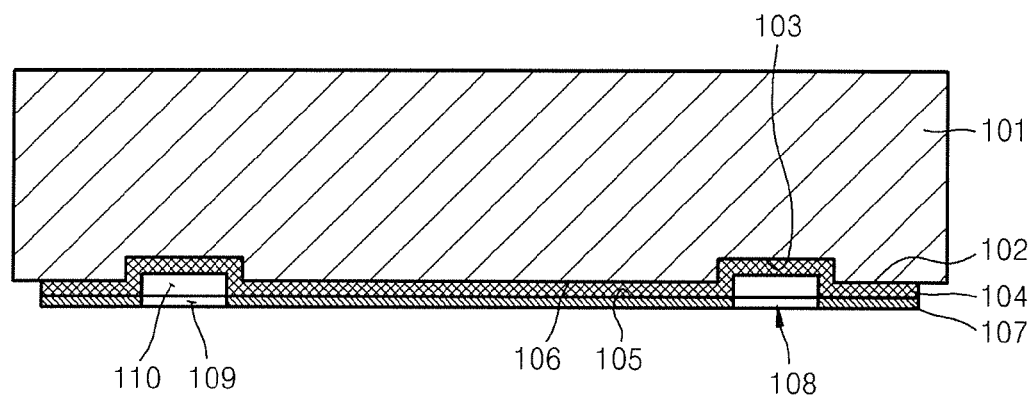
FIG. 1 is a cross-sectional view illustrating a sealing sheet and an adhesive, which are formed on a chuck, according to an exemplary embodiment of the present invention.

Aspects of embodiments of the present invention will now be described more fully with reference to the accompanying drawings, in which exemplary embodiments of the present invention are shown. The present invention may, however, be embodied in many different forms and should not be construed as being limited to the embodiments set forth herein; rather, these embodiments are provided so that this disclosure will be thorough and complete, and will fully convey the concept of the invention to those skilled in the art. The terminology used herein is for the purpose of describing particular embodiments only and is not intended to be limiting. As used herein, the singular forms "a," "an," and "the" are intended to include the plural forms, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. It will be understood that, although the terms "first," "second," etc. may be used herein to describe various elements; however, these elements should not be limited by these terms. These terms are only used to distinguish one element from another. In addition, when an element is referred to as being "on" another element, it may be directly on the another element or be indirectly on the another element with one or more intervening elements interposed therebetween.

An organic light-emitting display device according to exemplary embodiments of the present invention will now be described in detail with reference to the attached drawings. In the descriptions, the same or corresponding elements are denoted with the same reference numerals, and their repeated descriptions may be omitted.

Figure 2:
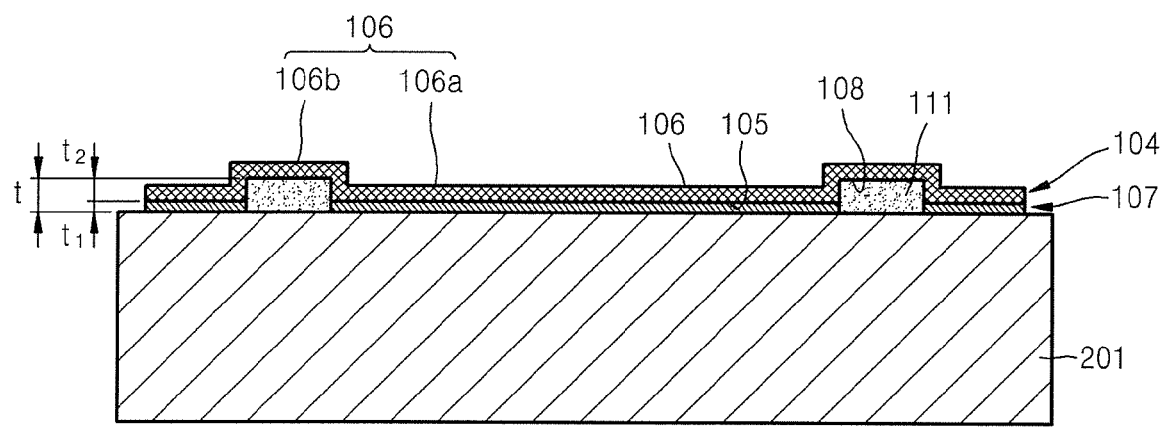
FIG. 2 is a cross-sectional view illustrating the sealing sheet and the adhesive of FIG. 1, which are formed on a substrate.

FIG. 1 is a cross-sectional view illustrating a sealing sheet 104 and an adhesive 107, which are formed on a chuck 101, according to an exemplary embodiment of the present invention. FIG. 2 is a cross-sectional view illustrating the sealing sheet 104 and the adhesive 107, which are formed on a substrate 201.

Referring to FIGS. 1 and 2, the chuck 101 is a structure which supports a substrate 201, on which an organic light-emitting device is formed, in a process of forming a thin film, or which supports a sealing sheet 104, which is attracted, adhered, or adsorbed onto the substrate 201, on which an organic light-emitting device is formed (e.g., formed in a sealing process). The chuck 101 may support the substrate 201 or the sealing sheet 104, for example, face-down in a chamber.

The chuck 101 may be an electrostatic chuck (ESC) or a physical sticky chuck (PSC). An electrode to be supplied with power is buried in a body of the ESC to attract or adsorb the substrate 201 or the sealing sheet 104 onto a surface of the body of the ESC by using static electricity. The PSC attracts or adheres, for example, an ionized film onto the surface of the body of the PSC to attract or adsorb the substrate 201 or the sealing sheet 104 onto a surface of the body of the PSC. The ESC will be described as an example in the present exemplary embodiments.

In one embodiment, grooves 103 are formed in a surface 102 of the chuck 101. The grooves 103 are formed, for example, at a surface opposite to (e.g., opposing or facing) the substrate 201 to a suitable depth in areas facing locations in which getters 111 are formed.

In one embodiment, the sealing sheet 104 is disposed (e.g., adhered or attracted) onto the surface 102 of the chuck 101. A second surface 106 of the sealing sheet 104 may be attracted or adsorbed onto the surface 102 of the chuck 101 in a sealing process.

In one embodiment, the adhesive 107 is formed (e.g., coated or sprayed) on the sealing sheet 104. The adhesive 107 may be formed on a first surface 105 of the sealing sheet 104 opposite to the second surface 106 of the sealing sheet 104. The adhesive 107 may be formed in at least one area of the sealing sheet 104.

In one embodiment, getter-housing grooves 108 are formed from a surface opposite to the substrate 201 to a suitable depth in the sealing sheet 104 and the adhesive 107. The getters 111 may fill the getter-housing grooves 108.

The sealing sheet 104 may have a size that covers an upper area of the substrate 201 (e.g., a display area for realizing an image). A thin film, such as an organic light-emitting device or the like, may be formed on the substrate 201. The sealing sheet 104 may seal (e.g., completely seal) a part (e.g., an upper part) of the substrate 201 from the outside to reduce or prevent (or substantially prevent) penetration of for example, moisture or oxygen in the air.

In one embodiment, the sealing sheet 104 is formed of a thin film sheet having flexibility, e.g., a thin film metal sheet such as aluminum, stainless steel, copper, nickel, or the like. Alternatively, in another embodiment, in order to reinforce an insulating characteristic, the sealing sheet 104 is formed by forming a film of a polymer resin, such as polyamide, polyester, polyethylene terephthalate, polycarbonate, nylon, or the like, on a surface of a metal sheet.

In one embodiment, the adhesive 107 is coated on the first surface 105 of the sealing sheet 104. The adhesive 107 is interposed between the sealing sheet 104 and the substrate 201. The adhesive 107 attaches (e.g., bonds) the first surface 105 of the sealing sheet 104 onto the upper area of the substrate 201. The adhesive 107 may be formed of a material such as epoxy.

The getter-housing grooves 108 may be formed in the sealing sheet 104 and the adhesive 107.

In one embodiment, the getter-housing grooves 108 include opened first areas 109 (e.g., opened first areas 109 in an adhesive layer) to which the adhesive 107 is not applied and second areas 110 of the sealing sheet 104, which are connected to (or continuous with) the opened first areas 109 in a direction (e.g., a vertical direction) from the first surface 105 of the sealing sheet 104 opposite to the substrate 201 (e.g., a direction away from the first surface 104, which faces the substrate 201, to the substrate 201). The opened first areas 109 and the second areas 110 may have groove shapes which extend in a thickness direction of the sealing sheet 104.

In one embodiment, the second surface 106 of the sealing sheet 104, which is opposite to the first surface 105 opposite to (e.g., facing) the substrate 201, has a step difference. In other words, the second surface 106 includes protrusion parts 106b, which protrude from horizontal parts 106a in a direction receding from the sealing sheet 104 (e.g., away from the substrate 201). Here, the second areas 110 are formed in the sealing sheet 104 in a vertical direction from the protrusion parts 106b due to the protrusion parts 106b. Or, defined yet another way, the second areas 110 are surrounded on three sides by the sealing sheet 104, and are defined by the protrusion parts 106b (i.e., defined by the step difference).

The adhesive 107 coated on the first surface 105 of the sealing sheet 104 does not cover parts in which the second areas 110 are formed. Areas where the adhesive 107 is not covering the second areas includes the opened first areas 109 (which, alternatively, may be described as, the opened first areas 109 of the adhesive layer include the areas adjacent to the second areas 110, where the adhesive 107 is not formed). The opened first areas 109 are connected to (or continuous with) the second areas 110 in a direction from the first surface 105 of the sealing sheet 104 toward the substrate 210.

The adhesive layer, which includes the adhesive 107, may be coated on at least one area of the first surface 105 of the sealing sheet 104, for example, the whole area of the first surface 105 of the sealing sheet 104, or may be partially coated along an edge (or edges) of the sealing sheet 104. The adhesive layer includes the opened first areas 109.

As described above, the getter-housing grooves 108 may be formed in (or by) the sealing sheet 104 and the adhesive 107, coated on the first surface 105 of the sealing sheet 104, to connect (or combine) the opened first areas 109 to the second areas 110 in a vertical direction (e.g., a direction from the sealing sheet 104 to the substrate 210).

The getters 111 fill in the getter-housing grooves 108. The getters 111 may be formed of a liquid or paste material. The getters 111 may include a material for easily absorbing oxygen in the air or moisture, e.g., powdered calcium oxide (CaO), selenium oxide (SeO), or a compound of metallic oxide and acrylic resin. The getters 111 may be coated by using a liquid material or by adjusting viscosity and using a spray method.

In one embodiment, thicknesses t of the coated getters 111 correspond to the sum of thicknesses t1 of the opened first areas 109 of the adhesive 107 and thicknesses t2 of the second areas 110 of the sealing sheet 104.

A result of testing a filling amount of the getters 111 according to a test of an exemplary embodiment of the present invention is as shown in Table 1 below.

TABLE 1

| | Comparison Example | Exemplary Embodiment |
|---|---|---|
| Cell width coated with getter | 2800 μm | 2800 μm |
| Cell height coated with getter | 20 μm | 40 μm |
| Longitudinal Section Area | 56,000 μm² | 112,000 μm² |

Here, in the comparison example, second areas are not formed in a sealing sheet, and an adhesive having opened first areas is coated on a surface of the sealing sheet. In the exemplary embodiment, the second areas 110 are formed in the sealing sheet 104, and the adhesive 107, having the opened first areas 109, is formed on the first surface 105 of the sealing sheet 104.

In the comparison example, a cell width 2800 μm, a cell height corresponding to thicknesses of the opened first areas is 20 μm, and a longitudinal section volume area with a getter is 56,000 μm2. In the exemplary embodiment, a cell width is 2800 μm, a cell height corresponding to the sum of the thicknesses t1 of the opened first areas 109 and the thicknesses t2 of the second areas 110 is 40 μm, and a longitudinal section area filled with the getter 111 is 112,000 μm². As described above, the longitudinal section area of the exemplary embodiment increases to double the longitudinal section area of the comparison example.

In the exemplary embodiment, the sealing sheet 104 has the protrusion parts 106b which protrude from the second surface 106 in the rear of the sealing sheet 104 which is a direction receding from the substrate 201. Therefore, the second areas 110 are formed in the sealing sheet 104 in a vertical direction. As a result, a larger amount of getters 111 may fill spaces of the second areas 110.

The sealing sheet 104 may be formed to have a step difference by using various methods. In one embodiment, chuck 101 is used in a sealing process. The grooves 103 having suitable depths are formed in the surface of the chuck 101. The grooves 103 have suitable sizes to house the protrusion parts 106b of the sealing sheet 104.

In the sealing process, the second surface 106 of the sealing sheet 104 contacts the surface 102 of the chuck 101 due to an attraction or adsorption force of the chuck 101. The protrusion parts 106b of the second surface 106 are then located in the grooves 103 formed in the chuck 101.

Alternatively, through an additional molding process, the protrusion parts 106b of the sealing sheet 104 protrude from the second surface 106 in the rear of the sealing sheet 104, and the sealing sheet 104, which has been molded, is attracted or adsorbed onto the chuck 101.

The sealing process of an OLED device 100 having the above-described structure will now be sequentially described.

Figure 3A:
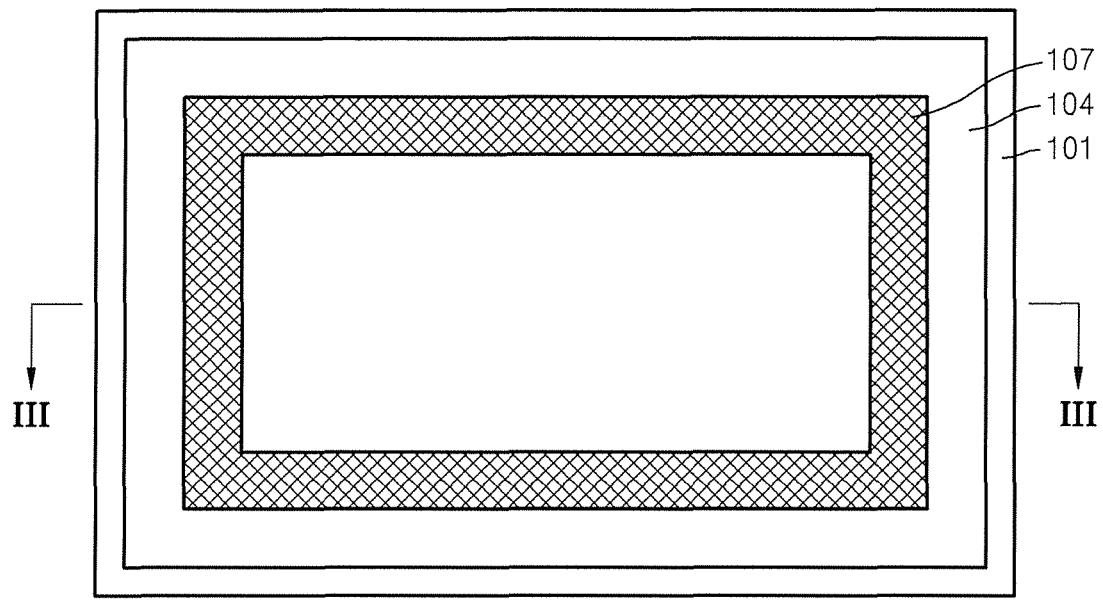
FIG. 3A is a plan view illustrating a chuck onto which a sealing sheet and an adhesive are adsorbed according to an exemplary embodiment of the present invention.
Figure 3B:
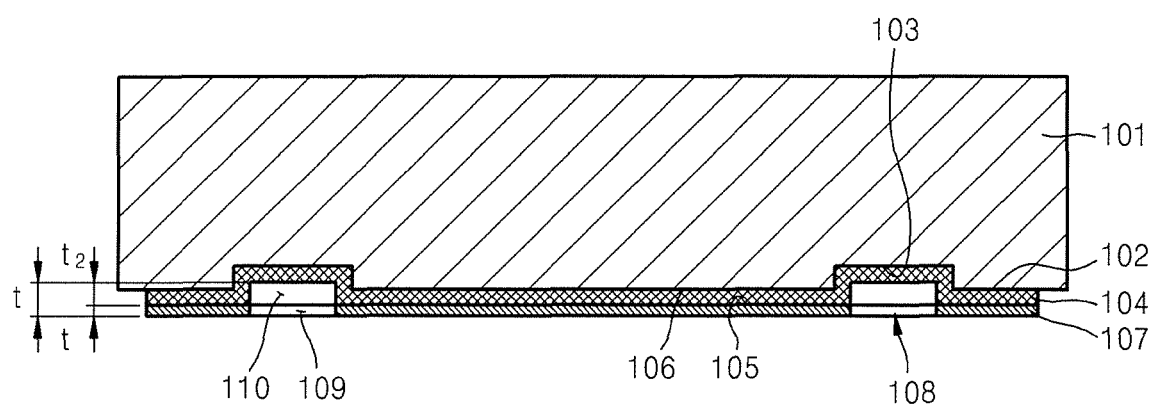
FIG. 3B is a cross-sectional view of FIG. 3A.

Referring to FIGS. 3A and 3B, the chuck 101 is provided. FIG. 3B illustrates to the chuck 101, a magnetic field is induced around the chuck 101, and the sealing sheet 104 is charged by the induced magnetic field and thus attracted or adsorbed onto the chuck 101.

Therefore, the second surface 106 of the sealing sheet 104 may contact a surface of the chuck 101 so that the sealing sheet 104 attaches or adheres onto the chuck 101. In one embodiment, the adhesive 107 is formed on the first surface 105 opposite to the second surface 106 of the sealing sheet 104.

The sealing sheet 104 may be formed of a flexible material. Therefore, when the sealing sheet 104 is adsorbed onto the chuck 101, partial areas of the second surface 106 of the sealing sheet 104 are inserted into the grooves 103 which are formed in the chuck 101 to have the suitable depth.

Therefore, the sealing sheet 104 may have the protrusion parts 106b, which protrude from the horizontal parts 106a of the second surface 106 in a direction away from first surface 105 of the sealing sheet 104. Due to the formation of the protrusion parts 106b, the second areas 110 are formed in (or by) the sealing sheet 104 in a vertical direction from the sealing sheet 104.

The adhesive 107 may be coated on the whole first surface 105 of the sealing sheet 104 or may be partially coated along the edge of the first surface 105. Here, the adhesive 107 does not cover the parts in which the second areas 110 are formed, that is, the opened first areas 109. The opened first areas 109 are connected to (or continuous with) the second areas 110 in a vertical direction from the first surface 105 of the sealing sheet 104.

Therefore, the getter-housing grooves 108, which connect (or combine) the opened first areas 109 to the second areas 110 in a vertical direction, are formed in the sealing sheet 104 and the adhesive 107, which is coated on the first surface 105 of the sealing sheet 104.

Figure 4A:
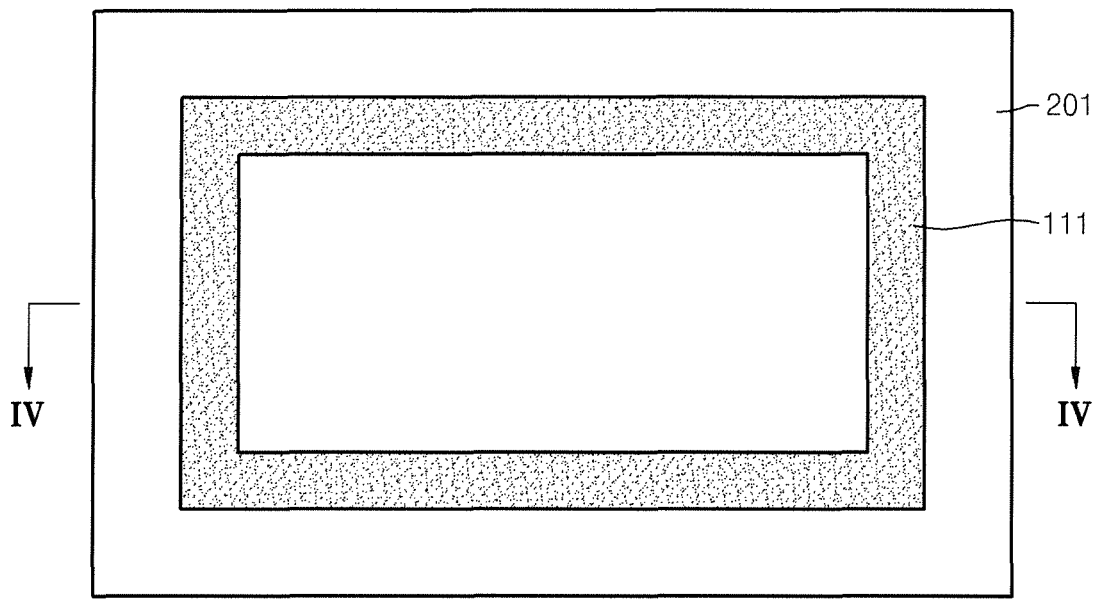
FIG. 4A is a plan view illustrating a getter, which is coated on a substrate according to an exemplary embodiment of the present invention.
Figure 4B:
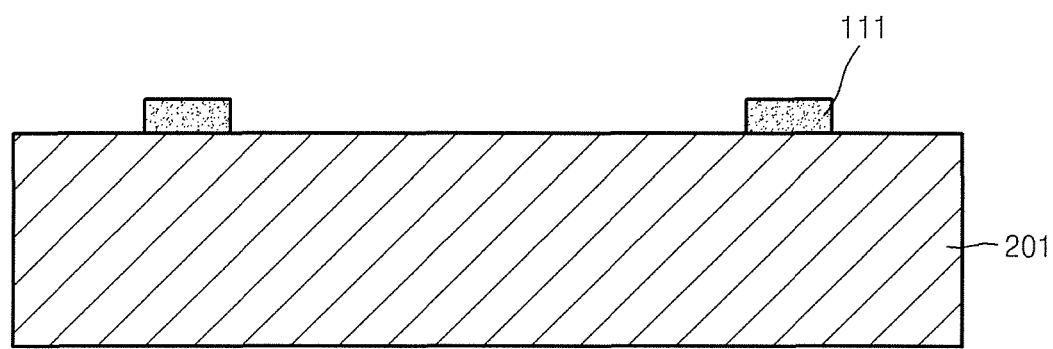
FIG. 4B is a cross-sectional view of FIG. 4A.

Referring to FIGS. 4A and 4B, the getter 111 is coated on the substrate 201.

FIG. 4B illustrates a cross-sectional view of FIG. 4A taken along the line IV-IV. A liquid or paste material may be coated on the substrate 201 to form the getter 111. In one embodiment, the getter 111 is coated by adjusting a dispenser or viscosity and, for example, using a spray method. The getter 111 may be formed of powdered calcium oxide (CaO), selenium oxide (SeO), or a compound of metallic oxide and acrylic resin, or any other suitable getter material.

Figure 5A:
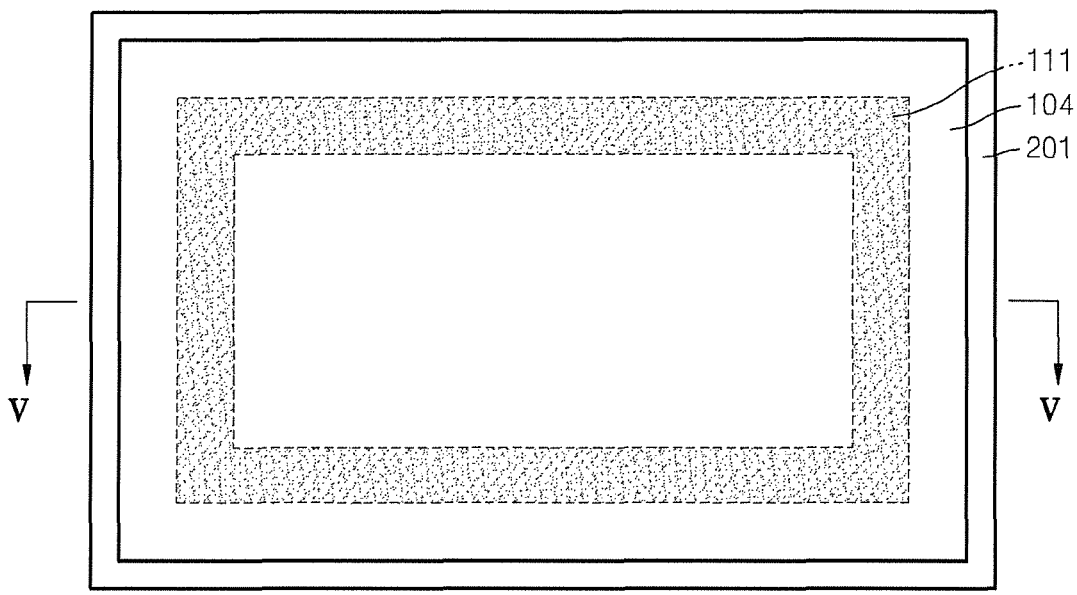
FIG. 5 is a plan view illustrating the sealing sheet and the adhesive of FIG. 3A, which adhere onto the substrate of FIG. 4A.
FIG. 5B is a cross-sectional view of FIG. 5A.
Figure 5B:
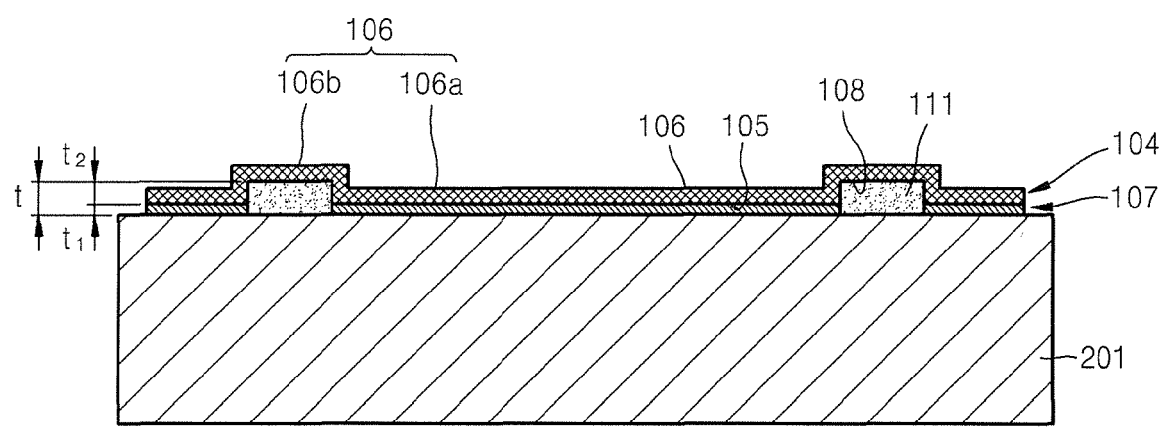

Referring to FIGS. 5A and 5B, in order to attach or bond the sealing sheet 104 onto the substrate 201, the substrate 201 and the sealing sheet 104 are arranged in suitable locations so that the getter 111 will be housed (or disposed) in the getter-housing groove 108. FIG. 5B is a cross-sectional view of FIG. 5A taken along the line V-V. Next, a compression (e.g., a vacuum compression) may be applied onto the substrate 201.

The thickness (or thicknesses) t of the coated getter 111 may correspond to the sum of the thicknesses t1 of the opened first areas 109 formed in (by) the adhesive 107 and the thicknesses t2 of the second areas 110 formed in (by) the sealing sheet 104.

As described above, the getter 111 fills (e.g., concurrently fills) the opened first areas 109 formed in (by) the adhesive 107 and the second areas 110 formed in (by) the sealing sheet 104 to have a step difference. Therefore, a filling area of the getter 111 may be extended.

The embodiments described above in connection with FIGS. 1-5B may be used in conjunction with an organic light emitting display device including a plurality of sub-pixels to protect the sub-pixels from the effects of moisture and/or oxygen.

Figure 6:
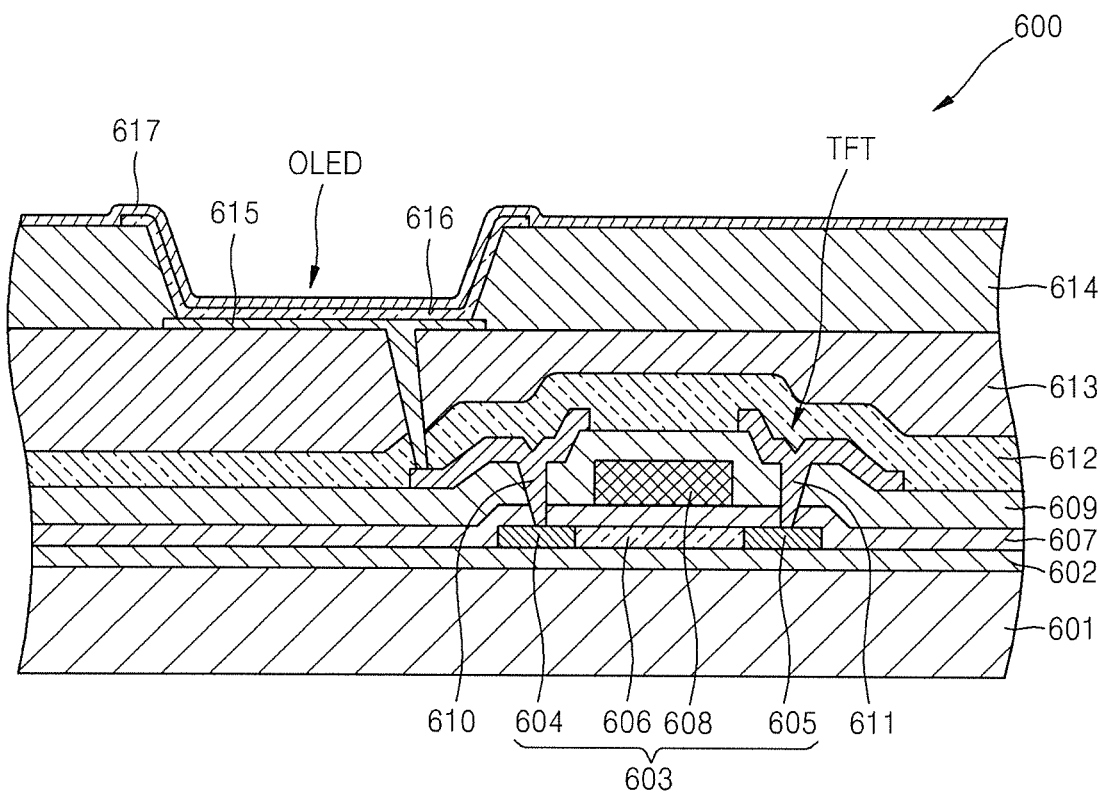
FIG. 6 is a cross-sectional view illustrating an organic light-emitting display device according to an exemplary embodiment of the present invention.
Figure 7:
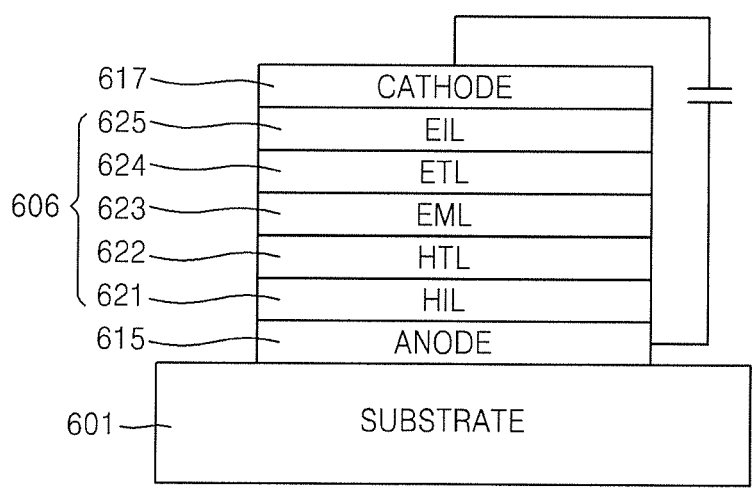
FIG. 7 is a schematic view illustrating the organic light-emitting display device of FIG. 6.

FIG. 6 illustrates one of a plurality of sub-pixels of an organic light-emitting display device 600 according to an exemplary embodiment of the present invention. FIG. 7 illustrates the organic light-emitting display device 600 of FIG. 6.

Here, the sub-pixels each have at least one thin film transistor (TFT) and an organic light-emitting display. The TFT is not necessarily limited to the structure of FIG. 6, and the number and structures of TFTs may be variously changed.

Referring to FIGS. 6 and 7, the organic light-emitting display device 600 includes a first substrate 601. The first substrate 601 may be an insulating substrate such as glass or plastic.

In one embodiment, a buffer layer 602 is formed on the first substrate 601. The buffer layer 602 has a structure in which organic materials and/or inorganic materials are stacked (e.g., alternately stacked). The buffer layer 602 may block oxygen and/or moisture, and may prevent moisture and/or impurities generated from the first substrate 601 from being diffused into the organic light-emitting display.

A semiconductor active layer 603 having a suitable pattern may be formed on the buffer layer 602. If the semiconductor active layer 603 is formed of polysilicon, amorphous silicon may be formed and crystallized into polysilicon.

The amorphous silicon may be crystallized by using various methods including rapid thermal annealing (RTA), solid phase crystallization (SPC), excimer laser annealing (ELA), metal-induced crystallization (MIC), metal-induced lateral crystallization (MILC), sequential lateral solidification (SLS), etc.

The semiconductor active layer 603 is doped with N-type or P-type dopant ions to form a source area 604 and a drain area 605. An area between the source and drain areas 604 and 605 is a channel area 606, which may not be doped with a dopant.

A gate insulating layer 607 is deposited on the semiconductor active layer 603. The gate insulating layer 607 may have a single layer formed of $SiO_2$ or a dual layer formed of $SiO_2$ and $SiN_x$.

A gate electrode 608 is formed in a suitable area of the gate insulating layer 607. The gate electrode 608 is electrically connected to a gate line (not shown) via which a TFT on/off signal may be applied. The gate electrode 608 may be formed of single or multiple metal and may be a single layer formed of Mo, MoW, Cr, Al, an Al alloy, Mg, Ni, W, or Au or a multi-layer structure formed of combinations thereof.

An interlayer insulating layer 609 may be formed on the gate electrode 608. Through contact holes, a source electrode 610 may be electrically connected to the source area 604, and a drain electrode 611 may be electrically connected to the drain area 605.

A passivation layer 612 may be formed of $SiO_2$, SiNx, or the like on the source and drain electrodes 610 and 611. A planarization layer 613 may be formed of an organic material, such as acryl, polyimide, benzocyclobutene (BCB), or the like, on the passivation layer 612.

In one embodiment, a first electrode 615 is formed on the planarization layer 613. A part of the first electrode 615 may be covered with a pixel-defining layer (PDL) 614, which is an insulating layer formed of an organic material, and the other part of the first electrode 615 may be exposed. The first electrode 615 is electrically connected to the source electrode 610 or the drain electrode 611.

An organic layer 616 is formed on the first electrode 615, which may be exposed by etching a part of the PDL 614. A second electrode 617 is formed on the organic layer 616.

The first and second electrodes 615 and 616 are insulated from each other by, for example, the organic layer 616, and voltages having different polarities are applied thereto to emit light from the organic layer 616.

The organic light-emitting display may emit red (R), green (G), and/or blue (B) lights according to a current to display suitable image information. The organic light-emitting display is electrically connected to the source electrode 610 or the drain electrode 611 and includes the first electrode 615, which may be supplied with positive power, the second electrode 617, which may cover all pixels and may be supplied with negative power, and the organic layer 616, which is disposed between the first and second electrodes 615 and 617. In one embodiment, the first electrode 615 operates as an anode, and the second electrode 617 operates as a cathode. However, polarities of the first and second electrodes 615 and 617 may be opposite thereto.

The first electrode 615 may be a transparent electrode or a reflective electrode.

If the first electrode 615 is used as a transparent electrode, the first electrode 615 may include ITO, IZO, ZnO, or $In_2O_3$. If the first electrode 615 is used as a reflective electrode, a reflective layer may be formed of Ag, Mg, Al, Pt, Pd, Au, Ni, Nd, Ir, Cr, or a compound thereof, and then ITO, IZO, ZnO, or $In_2O_3$ may be formed on the reflective layer.

The second electrode 617 may be a transparent electrode or a reflective electrode.

If the second electrode 617 is used as a transparent electrode, Li, Ca, LiF/Ca, LiF/Al, Al, Ag, Mg, or a compound thereof may be formed in a direction in which the organic layer 616 is formed, and then an auxiliary electrode layer or a bus electrode line may be formed of a transparent electrode material, such as ITO, IZO, ZnO, $In_2O_3$, or the like, thereon If the second electrode 617 is used as a reflective electrode, Li, Ca, LiF/Ca, LiF/Al, Al, Ag, Mg, or a compound thereof may be formed.

If the first electrode 615 is formed as a transparent electrode or a reflective electrode, the first electrode 615 is formed in a shape corresponding to an open shape of each pixel. The second electrode 617 is formed as a transparent electrode or a reflective electrode in an area of a display. The second electrode 617 may not necessarily be formed in a whole area of the display and may be formed in various patterns. Here, stacking positions of the first and second electrodes 615 and 617 are opposite.

The organic layer 616 may be a low molecular organic layer or a high molecular organic layer.

If the organic layer 616 is a low molecular organic layer, a hole injection layer (HIL) 621, as shown in FIG. 7, a hole transport layer (HTL) 622, an emission layer (EML) 623, an electron transport layer (ETL) 624, and an electron injection layer (EIL) 625 are stacked in a single structure or a compound structure to form the organic layer 616.

The organic layer 616 may be formed of an organic material such as copper phthalocyanine (CuPc), (N,N'-Di(naphthalene-1-yl)-N,N'-diphenyl-benzidine (NPB), tris-8-hydroxyquinoline aluminum (Alq3), etc.

If the organic layer 616 is the high molecular organic layer, the organic layer 616 includes an HTL and an EML. The HTL may be formed of PEDOT, and the EML may be formed of a high molecular organic material, such as, Poly-Phenylenevinylene (PPV), polyfluorene, or the like.

The organic layer 616 may not necessarily be limited thereto, and various exemplary embodiments may be applied.

A second substrate (not shown) may be further installed on the OLED. A glass substrate, a flexible substrate, or an insulating material may be coated to form the second substrate.

As described above, according to aspects of embodiments of the present invention, in an organic light-emitting display device and a method of manufacturing the same, a sealing sheet covers a substrate. Additionally, an adhesive is interposed between the sealing sheet and the substrate, and a getter-housing groove is formed to by the sealing sheet and the adhesive. A getter is filled in the getter-housing groove to increase a filling amount of the getter, as compared to an organic light-emitting display device without the getter-housing groove.

While the present invention has been particularly shown and described with reference to exemplary embodiments thereof, it will be understood by those of ordinary skill in the art that various changes may be made without departing from the spirit and scope of the present invention as defined by the following claims.

What is claimed is:

1. An organic light-emitting display device comprising:
a substrate;
a sealing sheet, which covers the substrate;
a getter, which is interposed between at least a portion of the substrate and the sealing sheet; and
an adhesive layer comprising an adhesive, which bonds the sealing sheet onto the substrate,
wherein the sealing sheet and the adhesive layer have a getter housing groove housing the getter, the sealing sheet comprises protrusion parts extending away from the substrate at a portion of the sealing sheet corresponding to the getter housing groove, and the getter housed in the getter housing groove completely surrounds a portion of the adhesive layer in a plane parallel to the substrate, and
wherein the adhesive layer has an open area between the protrusion parts and the substrate where the adhesive is not located.

2. An organic light-emitting display device comprising:
a substrate;
a sealing sheet, which covers the substrate;
a getter, which is interposed between at least a portion of the substrate and the sealing sheet; and
an adhesive layer comprising an adhesive, which bonds the sealing sheet onto the substrate,
wherein the sealing sheet and the adhesive layer have a getter housing groove housing the getter, the sealing sheet comprises protrusion parts extending away from the substrate at a portion of the sealing sheet corresponding to the getter housing groove, and the getter housed in the getter housing groove completely surrounds a portion of the adhesive layer in a plane parallel to the substrate,
wherein the getter-housing groove comprises opened first areas of the adhesive layer where the adhesive is not located and second areas of the sealing sheet, the second areas being continuous with the opened first areas in a direction away from a first surface of the sealing sheet that faces the substrate, and
wherein the opened first areas and the second areas have groove shapes which extend in a thickness direction of the sealing sheet.

3. The organic light-emitting display device of claim 2, wherein the adhesive is interposed between at least a portion of the substrate and the sealing sheet,
wherein the adhesive does not cover the second areas, and
wherein areas where the adhesive does not cover the second areas comprise the opened first areas.

4. The organic light-emitting display device of claim 1, wherein the sealing sheet is a flexible thin film sheet.

5. The organic light-emitting display device of claim 1, wherein the adhesive is located on a whole area of a surface of the sealing sheet.

6. The organic light-emitting display device of claim 1, wherein the adhesive is partially located along an edge of the sealing sheet.

7. The organic light-emitting display device of claim 2, wherein thicknesses of the getter are a sum of corresponding thicknesses of the opened first areas and corresponding thicknesses of the second areas.

8. The organic light-emitting display device of claim 2, wherein at least a portion of a second surface of the sealing sheet opposing the first surface of the sealing sheet has a step difference.

9. The organic light-emitting display device of claim 8, wherein the protrusion parts protrude from a horizontal part of the second surface of the sealing sheet to correspond to depths of the second areas in a direction receding away from the substrate.

* * * * *